(12) United States Patent
Tsai

(10) Patent No.: US 8,905,120 B2
(45) Date of Patent: Dec. 9, 2014

(54) HEAT DISSIPATING MODULE

(75) Inventor: Ho-Yuan Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 497 days.

(21) Appl. No.: 13/309,360

(22) Filed: Dec. 1, 2011

(65) Prior Publication Data
US 2012/0152491 A1   Jun. 21, 2012

(30) Foreign Application Priority Data
Dec. 20, 2010  (TW) .............................. 099144736 A

(51) Int. Cl.
F28F 9/00        (2006.01)
H01L 23/427   (2006.01)
H05K 7/20      (2006.01)

(52) U.S. Cl.
CPC .................................. H01L 23/427 (2013.01)
USPC ............................ 165/67; 165/80.2; 257/719

(58) Field of Classification Search
CPC .......... F16B 5/0266; F16B 5/10; F16B 21/02; H01L 24/72; H01L 23/40; H01L 23/4006; H01L 23/427
USPC .............. 165/67, 76, 80.2, 80.3, 185, 104.21; 361/704, 726; 257/718, 719; 411/349, 411/549, 553, 552
See application file for complete search history.

(56) References Cited

U.S. PATENT DOCUMENTS

| | | | | |
|---|---|---|---|---|
| 4,801,232 A * | 1/1989 | Hempel | ........................ | 411/552 |
| 6,219,244 B1 * | 4/2001 | Chen | ............................ | 361/704 |
| 6,473,305 B1 * | 10/2002 | Gordon et al. | ................ | 361/704 |
| 6,865,082 B2 | 3/2005 | Huang et al. | | |
| 7,167,370 B2 * | 1/2007 | Lee et al. | ....................... | 361/719 |
| 7,218,525 B2 * | 5/2007 | Lo et al. | ......................... | 361/719 |
| 7,349,218 B2 * | 3/2008 | Lu et al. | .................... | 361/679.32 |
| 7,606,031 B2 * | 10/2009 | Hsieh et al. | ................... | 361/700 |
| 7,606,032 B2 * | 10/2009 | Lin | .............................. | 361/709 |
| 7,639,502 B2 | 12/2009 | Hu et al. | | |
| 2010/0220443 A1 * | 9/2010 | Li | ............................ | 361/679.58 |

FOREIGN PATENT DOCUMENTS

| | | |
|---|---|---|
| CN | 268132 Y | 2/2005 |
| CN | 2681328 Y | 2/2005 |
| CN | 101137277 A | 3/2008 |

OTHER PUBLICATIONS

Chinese Office Action issued in Chinese Patent Application No. 201010606491.6, with English Translations, dated Apr. 21, 2014, 18 pages.

* cited by examiner

*Primary Examiner* — Tho V Duong
(74) *Attorney, Agent, or Firm* — Christie, Parker & Hale, LLP

(57) ABSTRACT

A heat dissipating module is adapted for dissipating thermal energy from an electronic element mounted on a circuit board, and includes a heat sink, a heat conductive board including a plurality of tube portions that extend through the circuit board, a heat conductive tube that interconnects the heat sink and the circuit board, and a plurality of fixing elements. Each fixing elements includes a first end part be secured to the heat conductive board, a second end part exposed from an end opening of a respective tube portion, and a pair of interference parts that extend resiliently, respectively and outwardly through lateral openings of the respective the tube portion for abutting against the circuit board. The heat dissipating module further includes a resilient unit disposed between and connected resiliently to the circuit board and the heat conductive board.

7 Claims, 5 Drawing Sheets

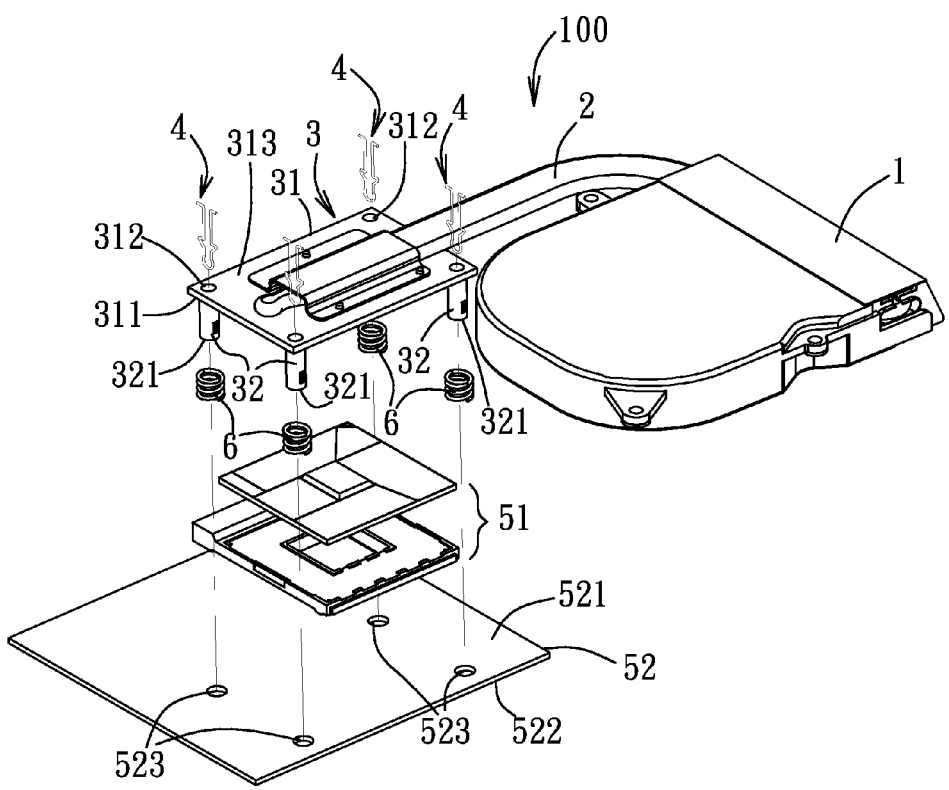
F I G. 2

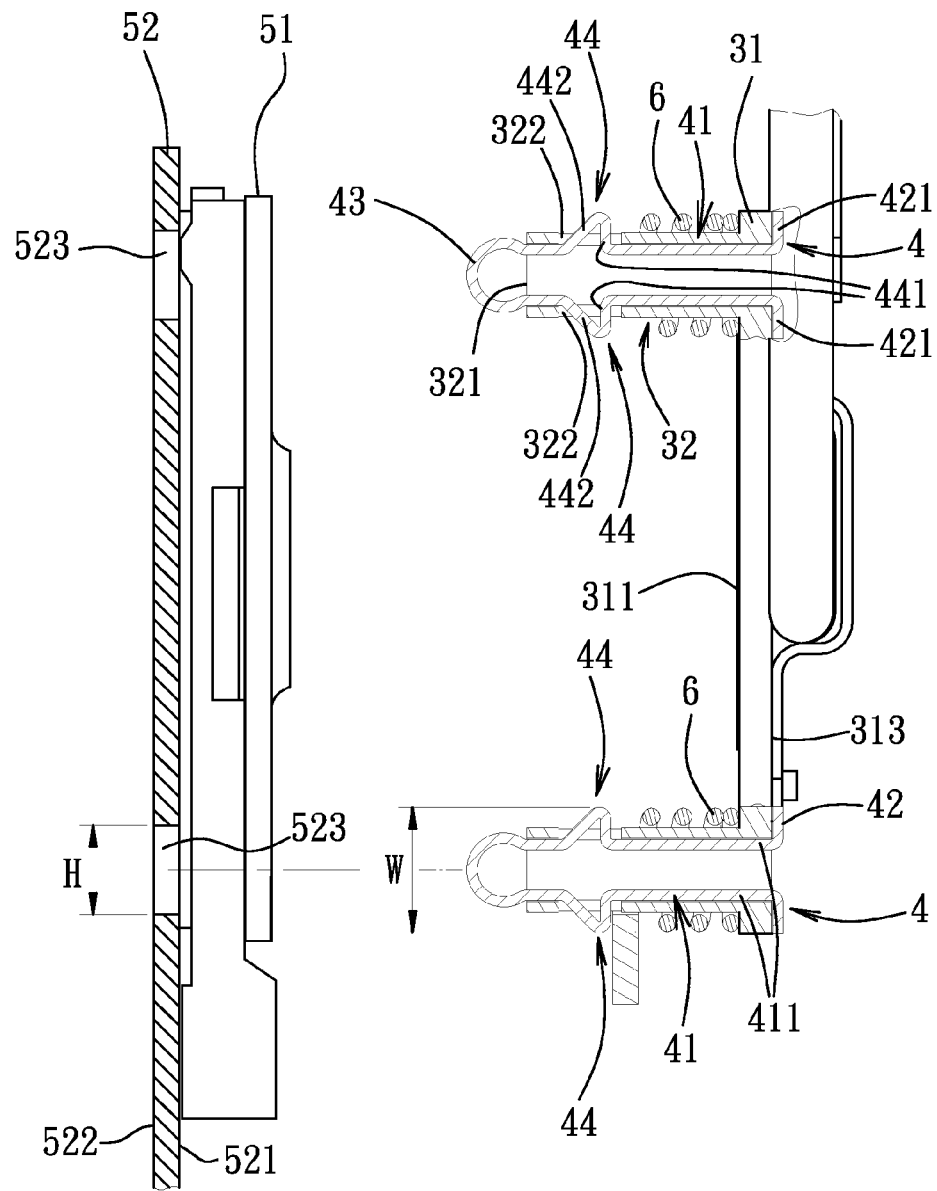
F I G. 4

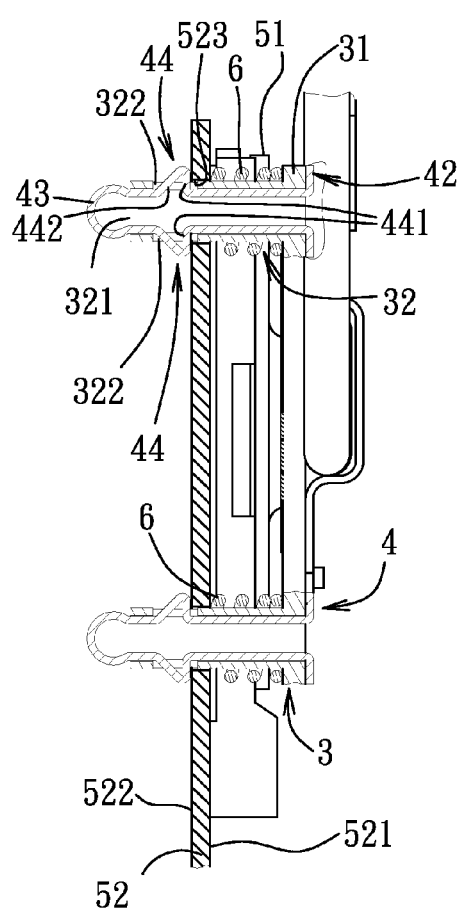
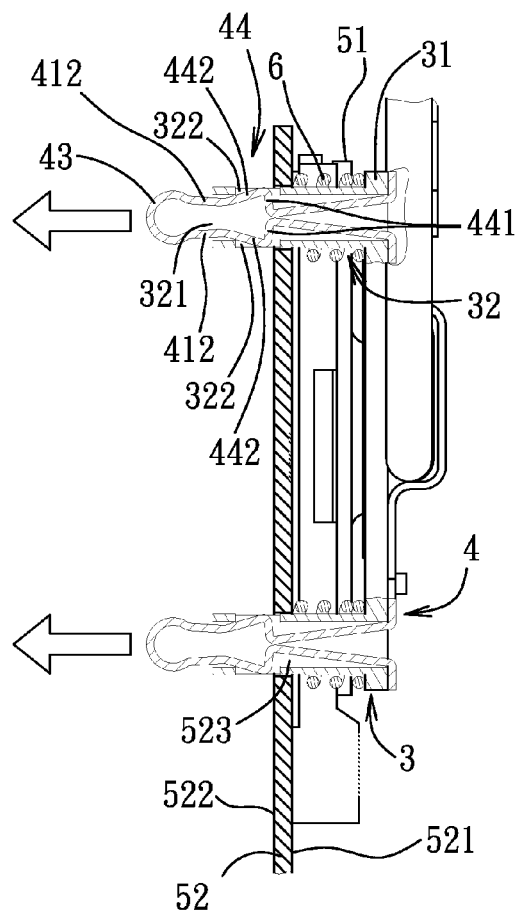
F I G. 7   F I G. 8

HEAT DISSIPATING MODULE

CROSS-REFERENCE TO RELATED APPLICATION

This application claims priority of Taiwanese Application No. 099144736, filed on Dec. 20, 2010.

BACKGROUND OF THE INVENTION

1. Field of the Invention

The invention relates to a heat dissipating module, more particularly to a heat dissipating module having a fixing structure.

2. Description of the Related Art

A conventional heat dissipating module (as disclosed in U.S. Pat. No. 6,865,082 for example) is adapted for use with a central processing unit (CPU) of a computer host and includes a heat sink, a heat conductive board for being attached to an electronic element, and a heat conductive tube interconnecting the heat sink and the heat conductive board. Thermal energy produced during operation of the electronic element is absorbed by the heat conductive board and conducted to the heat sink via the heat conductive tube, to be dissipated directly therefrom or with assistance of a fan. A screw fastener or a press strip may be applied in order to make sure that the heat conductive board is fixed firmly onto the electronic element.

SUMMARY OF THE INVENTION

The object of the present invention is to provide a heat dissipating module having a fixing structure for coupling to and being fixed on a circuit board that is relatively simple and easy to be attached to and detached from the circuit board compared to the prior art.

According to the present invention, a heat dissipating module is adapted for dissipating thermal energy from an electronic element mounted on a circuit board. The circuit board has a first board surface and a second board surface, and the electronic element is mounted on the first board surface. The heat dissipating module comprises a heat sink, a heat conductive board, a heat conductive tube, a plurality of fixing elements and a resilient unit. The heat conductive board includes a board body and a plurality of tube portions. The board body has a third board surface adapted to confront the electronic element, and the tube portions protrude from the third board surface of the board body, and are adapted to extend through the circuit board. Each of the tube portions defines an end opening that is distal from the third board surface, and has a pair of lateral openings. The heat conductive tube interconnects the heat sink and the board body of the heat conductive board. The fixing elements extend respectively through the tube portions of the heat conductive board. Each of the fixing elements includes a longitudinally extending part, a first end part, a second end part and a pair of interference parts. The longitudinally extending part is disposed in a respective one of the tube portions. The first end part is connected to an end of the longitudinally extending part and is adapted to be secured to the board body. The second end part is connected to an opposite end of the longitudinally extending part and is exposed from the end opening of the respective one of the tube portions. The interference parts are connected to the longitudinally extending part between the first and second end parts. The interference parts extend resiliently, respectively and outwardly through the lateral openings of the respective one of the tube portions, and are adapted for abutting against the second board surface of the circuit board. The resilient unit is adapted to be disposed between and connected resiliently to the first board surface of the circuit board and the third board surface of the heat conductive board.

The effect of the present invention is the capability that enables the heat dissipating module to be attached and fixed onto the circuit board by providing the fixing elements that engage the tube portions on the board body of the heat conductive board. Additionally, the tube portions may also be formed integrally on the board body of the heat conductive board. Thus, compared to the prior art, the present invention has a relatively simple structure, and the heat conductive board thereof is relatively easy to be attached to and detached from the circuit board.

BRIEF DESCRIPTION OF THE DRAWINGS

Other features and advantages of the present invention will become apparent in the following detailed description of the preferred embodiment with reference to the accompanying drawings, of which:

FIG. 2 is a partly exploded perspective view of the preferred embodiment;

FIG. 4 is a partially sectional view of the preferred embodiment, wherein a heat conductive board has tube portions that extend respectively toward first through holes in a circuit board;

FIG. 7 is still another sectional view of the preferred embodiment, wherein the heat conductive board is fixed onto the circuit board; and FIG. 8 is yet another sectional view of the preferred embodiment, wherein each of the fixing elements has a second part that is being pulled, thereby retracting the interference parts into corresponding lateral openings of the tube portions.

DETAILED DESCRIPTION OF THE PREFERRED EMBODIMENT

Other features and advantages of the present invention will become apparent in the following detailed description of the preferred embodiment with reference to the accompanying drawings.

Figure 1:
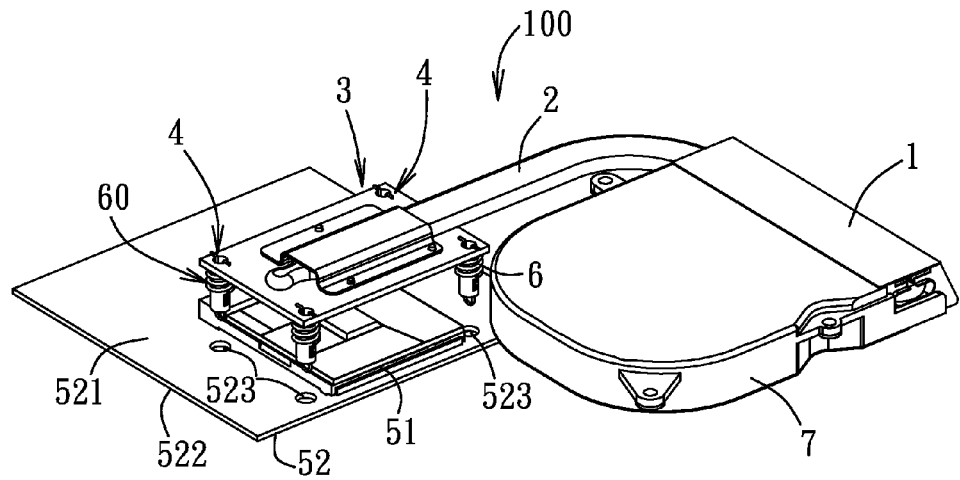
FIG. 1 is a perspective view of a preferred embodiment of a heat dissipating module according to the invention.

As shown in FIG. 1, the preferred embodiment of a heat dissipating module 100 of the present invention comprises a heat sink 1, a heat conductive tube 2, a heat conductive board 3, a plurality of fixing elements 4, a resilient unit 60 and a fan 7. The heat conductive tube 2 interconnects the heat sink 1 and the heat conductive board 3. The fixing elements 4 are provided on the heat conductive board 3 to enable the latter to be fixed onto a circuit board 52 that is mounted with an electronic element 51, in order to connect the heat conductive board 3 to the electronic element 51, thereby absorbing thermal energy produced during operation of the electronic element 51. The detailed structure of the heat dissipating module 100 is described in the following.

It is noted beforehand that, in this preferred embodiment, the circuit board 52 has a first board surface 521 and a second board surface 522. The electronic element 51 is mounted on the first board surface 521 of the circuit board 52. The circuit board 52 is formed with a plurality of first through holes 523 extending through the first and second board surfaces 521, 522.

Referring to FIG. 2, the heat conductive board 3 includes a board body 31 connected to the heat conductive tube 3, and a plurality of tube portions 32. The board body 31 has a third board surface 311 adapted to confront the electronic element 51, a fourth board surface 313 opposite to the third board surface 311, and a plurality of second through holes 312 formed thereon and corresponding in position to the first through holes 523 in the circuit board 52. The tube portions 32 protrude from the third board surface 311 of the board body 31 correspond in position to the second through holes 312 such that the internal space of each of the tube portions 32 is in spatial communication with a corresponding one of the second through holes 312 and are adapted to extend through the circuit board 52. Each of the tube portions 32 defines an end opening 321 that is distal from the third board surface 311 of the board body 31.

Figure 3:
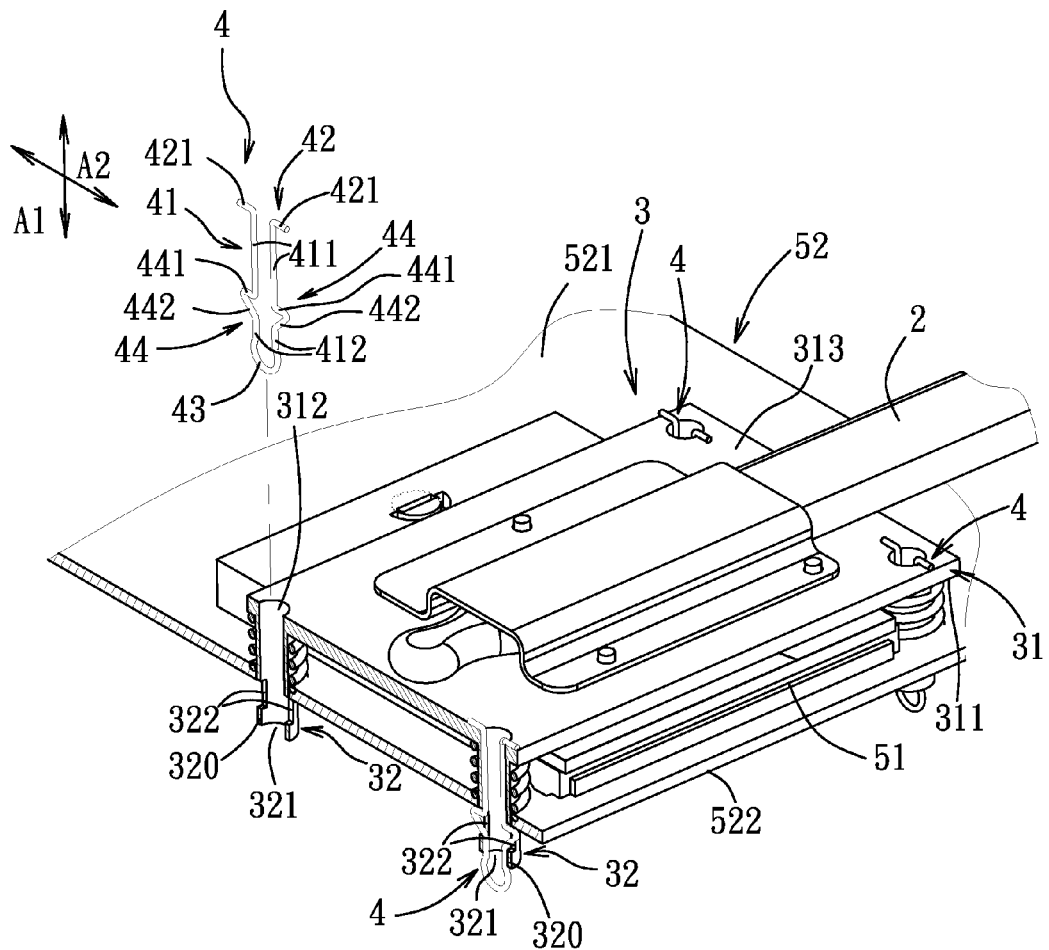
FIG. 3 is a fragmentary, partly exploded, cutaway perspective view of the preferred embodiment.
Figure 5:
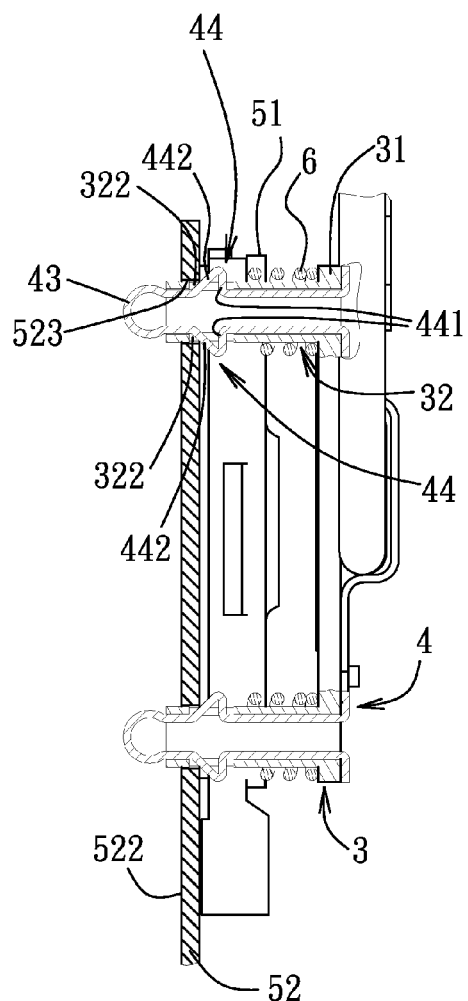
FIG. 5 is a sectional view of the preferred embodiment, illustrating an initial stage of extension of the tube portions of the heat conductive board through the first through holes in the circuit board.

In particular, further referring to FIG. 3, each of the tube portions 32 includes a tube wall 320 having an end that is connected to the board body 31 at a position corresponding to a respective one of the second through holes 312, and an opposite end that defines the end opening 321. Moreover, each of the tube walls 320 further has a pair of diametrically-opposite lateral openings 322 adjacent to the end opening 321. The functions of the lateral openings 322 will be described later.

Further referring to FIG. 4, the fixing elements 4 extend respectively through the tube portions 32 of the heat conductive board 3. Each of the fixing elements 4 has a longitudinally extending part 41 disposed in a respective one of the tube portions 32, a first end part 42 that is connected to an end of the longitudinally extending part 41 and adapted to be secured to the board body 31, a second end part 43 that is connected to an opposite end of the longitudinally extending part 41 and exposed from the end opening 321 of the respective one of tube portions 32, and a pair of interference parts 44 that are connected to the longitudinally extending part 41 between the first and second end parts 42, 43, and extending resiliently and outwardly through the respective one of the tube portions 32. In this embodiment, the longitudinally extending part 41 of each fixing element 4 includes a pair of first segments 411 extending in a longitudinal direction (A1) and spaced apart from each other. Each of the interference parts 44 is connected to an end of a respective one of the first segments 411. The first end part 42 includes a pair of transverse sections 421, each being connected to an opposite end of the respective one of the first segments 411. The transverse sections 421 extend away from each other in a transverse direction (A2) substantially transverse to the longitudinal direction (A1). The transverse sections 421 abut against the fourth board surface 313 of the board body 31. The interference parts 44 of each fixing elements 4 extend respectively and outwardly through the lateral openings 322 of the tube wall 320 of the corresponding tube portions 32.

Further, in this embodiment, the longitudinally expending part 41 of each fixing element 4 further includes two second segments 412 extending in the longitudinal direction (A1). Each of the interference parts 44 of each fixing element 4 is connected to an end of a respective one of the second segments 412 (i.e., the interference parts 44 interconnect the first and second segments 411, 412). The second end part 43 is connected to the second segments 412 at a position opposite to the interference parts 44. In this embodiment, the second end part 43 is arc-shaped to be exposed from the end opening 321 of the corresponding tube portion 32.

The interference parts 44 of each fixing element 4 include a pair of stop sections 441 that extend respectively from the ends of the first segments 411 of the corresponding fixing element 4 away from each other in the transverse direction (A2) and a pair of oblique guide sections 442 extending respectively and obliquely from distal ends of the stop sections 441, and connected respectively to the ends of the second segments 412 (i.e., the oblique guide sections 442 interconnect the stop sections 441 and the second segments 412). Each of the stop sections 441 and the connected second sections 442 are arranged in a wedge shape configuration, and a maximum width (W) between the distal ends of the stop sections 441 of each fixing element 4 is larger than a diameter (H) of each of the first through holes 523.

The resilient unit 60 includes a plurality of resilient elements 6. In this embodiment, the resilient elements 6 are compression springs sleeved respectively on the tube portions 32. Each of the resilient elements 6 is disposed between the third board surface 311 of the board body 31 and the interference parts 44 of the corresponding fixing element 4.

Figure 6:
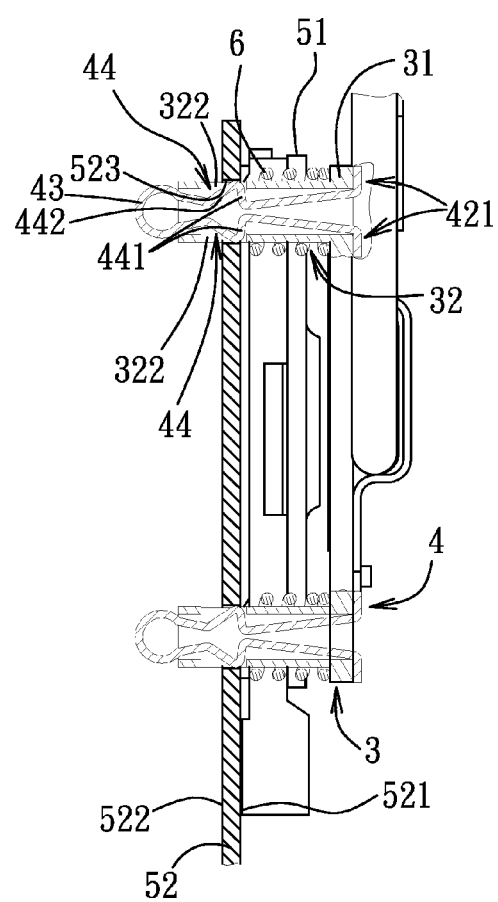
FIG. 6 is another sectional view of the preferred embodiment, illustrating fixing elements each having interference parts that are compressed during the extension of the tube portions of the heat conductive board through the first through holes in the circuit board.

Referring to FIGS. 4 to 7, to couple the heat conductive board 3 to the circuit board 52 for contacting the electronic element 51, the tube portions 32 of the heat conductive board 3 are placed toward the first board surface 521 of the circuit board 52 (see FIG. 4), and moved to extend respectively through the first through holes 523 of the circuit board 52. Also, as shown in FIG. 6, during the extension of each of the tube portions 32 through the corresponding first through holes 523, since the oblique guide sections 442 are exposed obliquely from the lateral openings 322, the interference parts 44 will be gradually compressed by the inner surface that defines the first through holes 523 and resiliently deform to retract into the corresponding tube portion 32. As shown in FIG. 7, when the lateral openings 322 are entirely moved through the first through holes 523, the interference parts 44 are once again exposed outwardly of the lateral openings 322 by virtue of restoring force of the resilient elements 6, such that the stop sections 441 of the interference parts 44 abut against the second board surface 522 of the circuit board 52 to thereby retain the heat conductive board 3 and the circuit board 52 between the first end part 42 and the interference parts 44 and prohibit displacement of the heat conductive board 3 away from the circuit board 52. At this time, the corresponding resilient element 6 is held with opposite ends connected resiliently to the first board surface 521 of the circuit board 52 and the board body 31 of the heat conductive board 3, and the heat conductive board 3 is hence positioned relative to the circuit board 52.

Referring to FIG. 8, to detach the heat conductive board 3 from the circuit board 52, the second end part 43 of each fixing element 4 is pulled in a direction away from the end opening 321 of the corresponding tube portion 32, thereby pulling the oblique guide segments 442 and the stop sections 441 of each fixing element 4 into the corresponding tube portion 32 by driving the interference parts 44 to retract toward each other into the corresponding tube portions 32 through the lateral openings 322, thereby preventing the stop sections 441 from abutting against the second surface 522 of the circuit board 52. Afterward, the heat conductive board 3 is permitted to move away from the first board surface 521 of the circuit board 52 until the tube portions 32 are removed from the corresponding first through holes 523 of the circuit board 52, thereby detaching the heat conductive board 3 from the circuit board 52.

In this embodiment, the resilient elements 6 are sleeved respectively on the corresponding one of the tube portions 32 of the heat conductive board 3. In other alternative forms, the resilient elements 6 may be disposed between and connected resiliently to the circuit board 52 and the board body 31 by other manners and configurations.

To sum up, the present invention provides the capability that enables the heat dissipating module 100 to be attached and fixed onto the circuit board 52 by providing the fixing elements 4 that engage the tube portions 32 on the board body 31 of the heat conductive board 3. Moreover, the tube portions 32 may also be formed integrally on the board body 31 of the heat conductive board 3. Compared to the prior art, the present invention has a relatively simple structure, and the heat conductive board 3 thereof is relatively easy to be attached to and detached from the circuit board 52.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A heat dissipating module adapted for dissipating thermal energy from an electronic element mounted on a circuit board, the circuit board having a first board surface and a second board surface, the electronic element being mounted on the first board surface, said heat dissipating module comprising:
    a heat sink;
    a heat conductive board including
        a board body that has a third board surface adapted to confront the electronic element, and
        a plurality of tube portions that protrude from said third board surface of said board body and that are adapted to extend through the circuit board, each of said tube portions defining an end opening that is distal from said third board surface and having a pair of lateral openings;
    a heat conductive tube interconnecting said heat sink and said board body of said heat conductive board;
    a plurality of fixing elements extended respectively through said tube portions of said heat conductive board, each of said fixing elements including
        a longitudinally extending part that is disposed in a respective one of said tube portions,
        a first end part that is connected to an end of said longitudinally extending part and that is adapted to be secured to said board body,
        a second end part that is connected to an opposite end of said longitudinally extending part and that is exposed from said end opening of the respective one of said tube portions, and
        a pair of interference parts that are connected to said longitudinally extending part between said first and second end parts, that extend resiliently, respectively and outwardly through said lateral openings of the respective one of said tube portions, and that are adapted for abutting against the second board surface of the circuit board; and
    a resilient unit adapted to be disposed between and connected resiliently to the first board surface of the circuit board and said third board surface of said heat conductive board.

2. The heat dissipating module as claimed in claim 1, wherein:
    said longitudinally extending part of each of said fixing elements has a pair of first segments and a pair of second segments extending in a longitudinal direction;
    said interference parts of each of said fixing elements interconnect said first and second segments of the corresponding one of said fixing elements, and extend away from each other in a transverse direction substantially transverse to the longitudinal direction;
    said second end part of each of said fixing elements is connected to said second segments of a corresponding one of said fixing elements; and
    said first end part of each of said fixing elements is connected to said first segments of the corresponding one of said fixing elements.

3. The heat dissipating module as claimed in claim 2, wherein said interference parts of each of said fixing elements have:
    a pair of stop sections extending respectively from said first segments of the corresponding one of said fixing elements away from each other in the transverse direction; and
    a pair of oblique guide sections extending respectively and obliquely from distal ends of said stop sections, and connected respectively to said second segments of the corresponding one of said fixing elements.

4. The heat dissipating module as claimed in claim 2, wherein:
    said board body of said heat conductive board further has a fourth board surface opposite to said third board surface; and
    said first end part of each of said fixing elements includes a pair of transverse sections extending respectively from said first segments of the corresponding one of said fixing elements, extending away from each other in the transverse direction, and abutting against said fourth board surface.

5. The heat dissipating module as claimed in claim 4, wherein said second end parts of each of said fixing elements is arc-shaped.

6. The heat dissipating module as claimed in claim 4, wherein each of said tube portions includes a tube wall having an end that is connected to said board body of said heat conductive board, and an opposite end that defines said end opening, and formed with said lateral openings.

7. The heat dissipating module as claimed in claim 1, wherein said interference parts of each of said fixing elements are resiliently deformable to retract into a corresponding one of said tube portions when said second end parts of the corresponding one of said fixing elements are pulled away from said end opening of the corresponding one of said tube portions, thereby permitting said heat conductive board to be detached from the circuit board.

* * * * *